United States Patent [19]

Berberich

[11] Patent Number: 5,332,966
[45] Date of Patent: Jul. 26, 1994

[54] METHOD OF COMPENSATING FOR THE TEMPERATURE OF INDUCTIVE SENSORS

[75] Inventor: Reinhold Berberich, Frankfurt, Fed. Rep. of Germany

[73] Assignee: VDO Adolf Schindling AG, Frankfurt am Main, Fed. Rep. of Germany

[21] Appl. No.: 959,738

[22] Filed: Oct. 13, 1992

[30] Foreign Application Priority Data

Dec. 13, 1991 [DE] Fed. Rep. of Germany ....... 4141065

[51] Int. Cl.⁵ .................. G01B 7/14; G01R 27/26
[52] U.S. Cl. .................. 324/207.12; 324/207.16; 324/225; 324/656
[58] Field of Search ........... 324/207.12, 207.15, 324/207.16, 207.17, 207.26, 224, 225, 227, 654, 656

[56] References Cited

U.S. PATENT DOCUMENTS

| | | | |
|---|---|---|---|
| 4,797,614 | 1/1989 | Nelson | 324/224 X |
| 5,015,948 | 5/1991 | Tew | 324/227 X |
| 5,043,661 | 8/1991 | Dubey | 324/207.15 X |
| 5,115,193 | 5/1992 | Bean et al. | 324/207.16 X |
| 5,180,978 | 1/1993 | Postma et al. | 324/207.16 |

Primary Examiner—Gerard R. Strecker
Attorney, Agent, or Firm—Martin A. Farber

[57] ABSTRACT

In a method and with a circuit for compensating for the temperature of inductive sensors having at least one coil from the inductance of which an output variable is formed as measure for a physical variable to be measured, a variable which is dependent on the resistance of the coil is measured and used for correction upon the forming of the output variable.

5 Claims, 3 Drawing Sheets

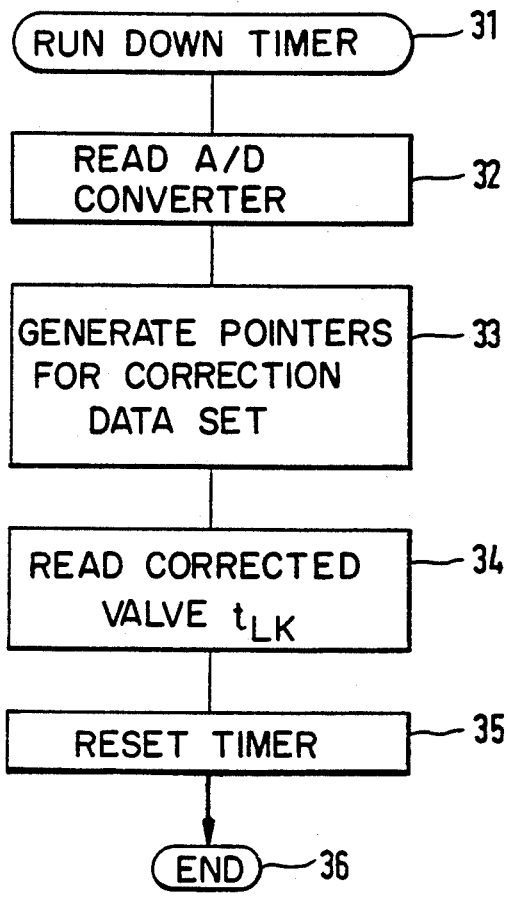
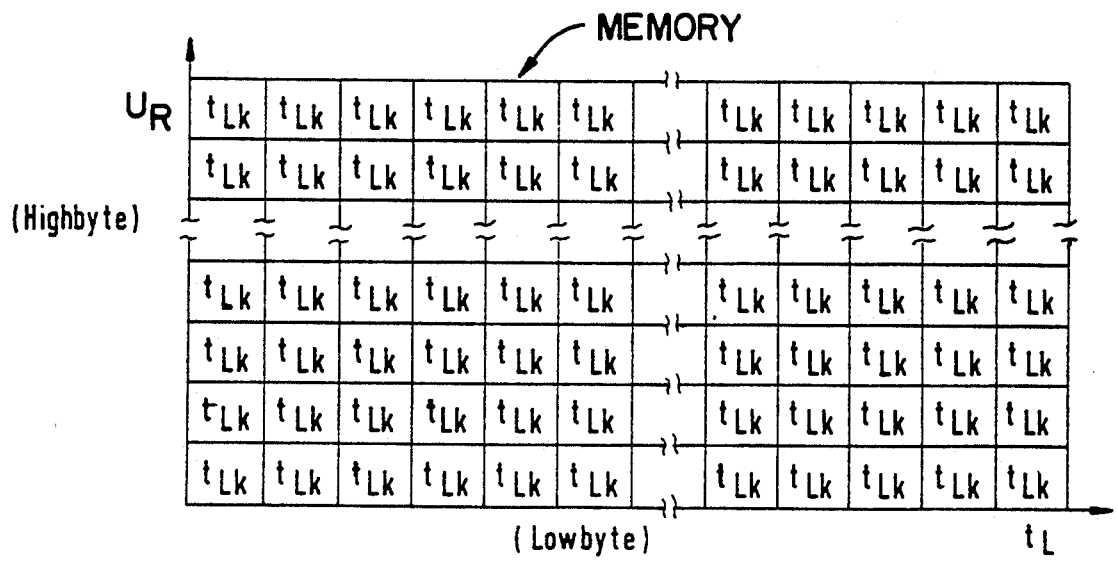

METHOD OF COMPENSATING FOR THE TEMPERATURE OF INDUCTIVE SENSORS

FIELD AND BACKGROUND OF THE INVENTION

The present invention relates to a method of compensating for the temperature of inductive sensors with at least one coil, the inductance providing an output variable which serves as a measure of a physical variable to be measured.

In inductive sensors, for example, inductive displacement transducers, measurement errors may result due to the temperature dependence of the inductance. Proposals have therefore already been made for compensating for the temperature of inductive sensors. In this connection, for instance, a temperature-dependent resistor may be connected in series with a coil of the sensor, or a separate temperature sensor may be associated with the inductive sensor. Both of these proposals, however, are sufficiently accurate only if the temperature-dependent resistor or the temperature sensor assumes the same temperature as the inductive sensor as the result of a suitable thermal coupling. Furthermore, the series connection of the temperature-dependent resistor requires exact pairing of the resistor with the coil of the inductive sensor. In addition, the technical expenditure is increased by the use of a separate sensor, in particular as a result of the additional cable and plug connectors.

SUMMARY OF THE INVENTION

It is an object of the present invention to provide temperature compensation of inductive sensors which is as accurate as possible and to do so at little technical expense.

In accordance with the invention, a variable which is dependent on the resistance of the coil is measured and is used for the correction in connection with the formation of the output variable.

In order to carry out the method of the invention, no additional expense is required with respect to the sensor. In particular, no parts which are adapted to the specific data of the sensor and no additional cable are required. The method of the invention furthermore has the advantage that the temperature compensation directly takes into account changes with time of the temperature of the sensor. There is no delay in time between temperature changes of the sensor and a separate temperature sensor and an additional temperature-dependent resistor.

A further development of the invention provides that a correction value for the output variable or a corrected output variable is obtained from a stored data set as a function of the variable measured. In this way, any desired compensation functions can be obtained in simple fashion with the use of a microcontroller or computer.

In accordance with another feature of the method of the invention, a reference voltage which is switched in pulse form is applied to a series connection consisting of a resistor and the coil. Immediately after application of the voltage, the speed of a reduction in voltage and, after a predetermined time, the voltage on the coil are measured. In this way, a deriving of the inductance and of the temperature-dependent coil resistance from the voltage at the coil is made possible in a particularly simple manner.

One advantageous circuit for the carrying out of the method of the invention is characterized by the fact that an input which is connected to the coil is connected also to an analog-signal input of a microcontroller, to a first input terminal of a comparator and, via a resistor and a controllable switch, to a source of reference voltage. Furthermore, a second input terminal of the comparator is connected, via a voltage divider, to the source of reference voltage, and an output terminal of the comparator is connected to an interrupt input of the microcontroller.

The formation of a negative voltage peak upon disconnection of the reference voltage is avoided in advantageous fashion in the manner that the input is furthermore connected to ground potential via a diode. A faster discharge of the inductance is possible by the use of a zener diode.

BRIEF DESCRIPTION OF THE DRAWINGS

With the above and other objects and advantages in view, the present invention will become more clearly understood in connection with the detailed description of the preferred embodiments, when considered with the accompanying drawings, of which:

FIG. 4 is a flow chart of a program which compensates as a function of the temperature for the value ascertained; and FIG. 5 shows an example of a correction data set.

DETAILED DESCRIPTION OF THE PREFERRED EMBODIMENT

Figure 1:
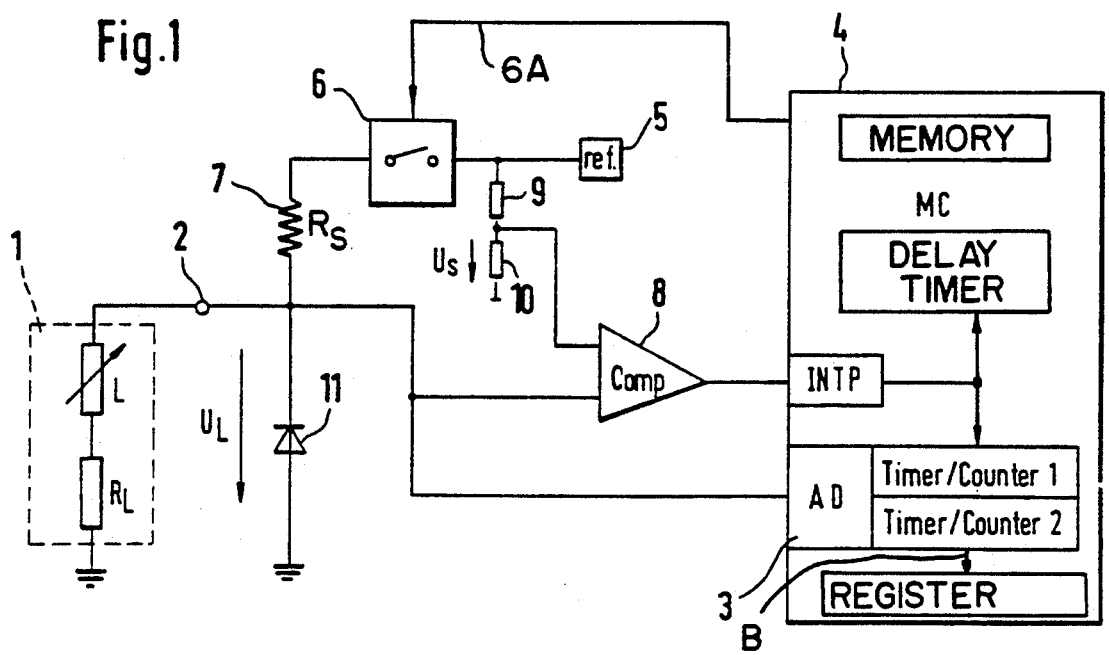
FIG. 1 is a circuit for carrying out the method of the invention.

In the circuit shown in FIG. 1, the coil 1 of a sensor (not otherwise shown) is connected on one side to ground potential and on the other side to an input 2. The coil 1 is shown as equivalent circuit with an inductor L which is dependent on the physical variable to be measured in each case and a temperature-dependent resistor $R_L$.

The input 2 is connected to the input of an analog/digital converter 3 which is part of a microcontroller 4. Furthermore, a source of reference voltage 5 is connected to the input 2 via a controllable switch 6 and a resistor 7 having a resistance $R_S$. Finally, a voltage $U_L$ at the input 2 is fed to a first input terminal of a comparator 8, the second input terminal of which is acted on by a portion $U_S$ of the reference voltage, which portion is determined by a voltage divider formed of resistors 9, 10. The voltage $U_S$ serves as a threshold for operation of the comparator 8. The output terminal of the comparator 8 is connected to an interrupt input INTP of the microcontroller 4. A diode 11 between the input 2 and ground potential serves to suppress negative voltage peaks upon disconnection of the reference voltage and assures the discharge of the inductor by the next measurement.

Figure 2:
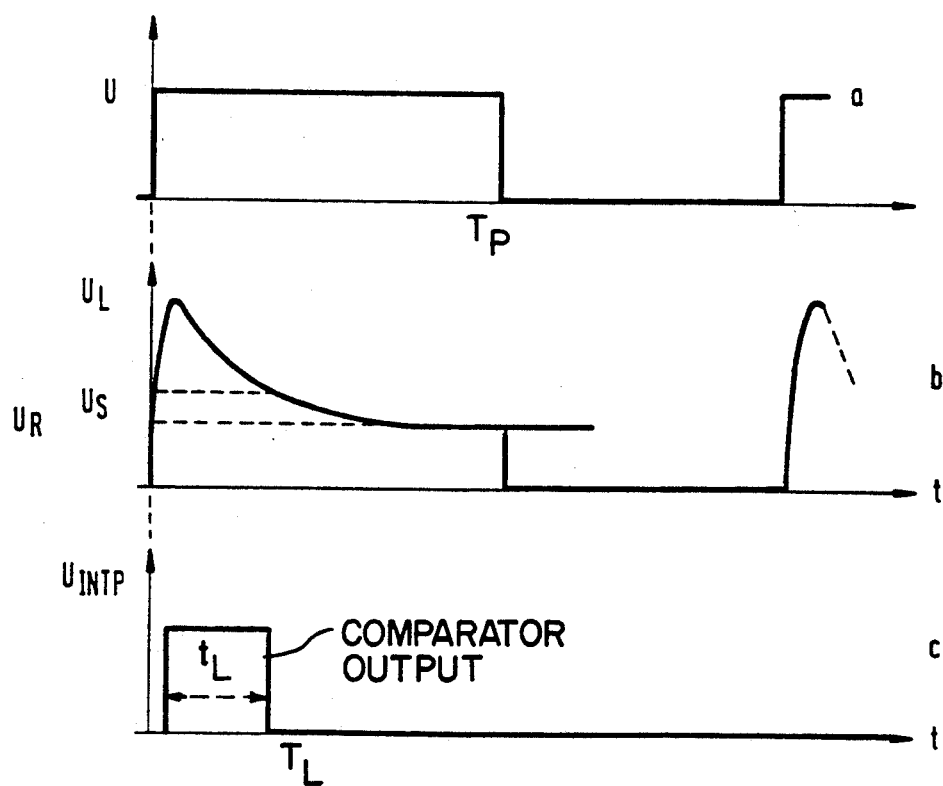
FIG. 2 is a time diagram of voltages which occur in the circuit of FIG. 1.

A rectangular control voltage, shown in line a of FIG. 2, is fed via line 6A to the controllable switch 6. The control voltage can be provided by the microcontroller 4 or by an independent pulse transmitter. The duration $T_p$ of the pulse is in this connection selected at least sufficiently long that the transient process caused by the inductance is concluded within this time $T_p$ so that the voltage drop on the coil resistor $R_L$ can still be measured before the end of the pulse.

Line b of FIG. 2 shows the voltage at the input 2 during the duration of a pulse of the control voltage. In this connection the increase in voltage at the start of the pulse is a result of the inductive behavior of the coil. The increase in voltage is reduced by parasitic capacitances. The inductance can be measured by the change, namely, the reduction, with time of the voltage. For this purpose, the voltage $U_L$ is compared by the comparator 8 with a threshold voltage $U_S$. The output voltage of the comparator 8 then has the shape shown in line c. As will be explained in further detail below with reference to FIGS. 3a and 3b, the pulse width $t_L$ at the comparator output is measured in the microcontroller 4. Furthermore, after a predetermined period of time during which the voltage $U_L$ has decreased by the ratio of the resistances $R_S$ and $R_L$ to the steady state value $U_R$, the voltage value $U_R$ is read into the microcontroller 4 and used for the temperature compensation, as will be explained in further detail with reference to FIG. 4.

Figures 3A, 3B:
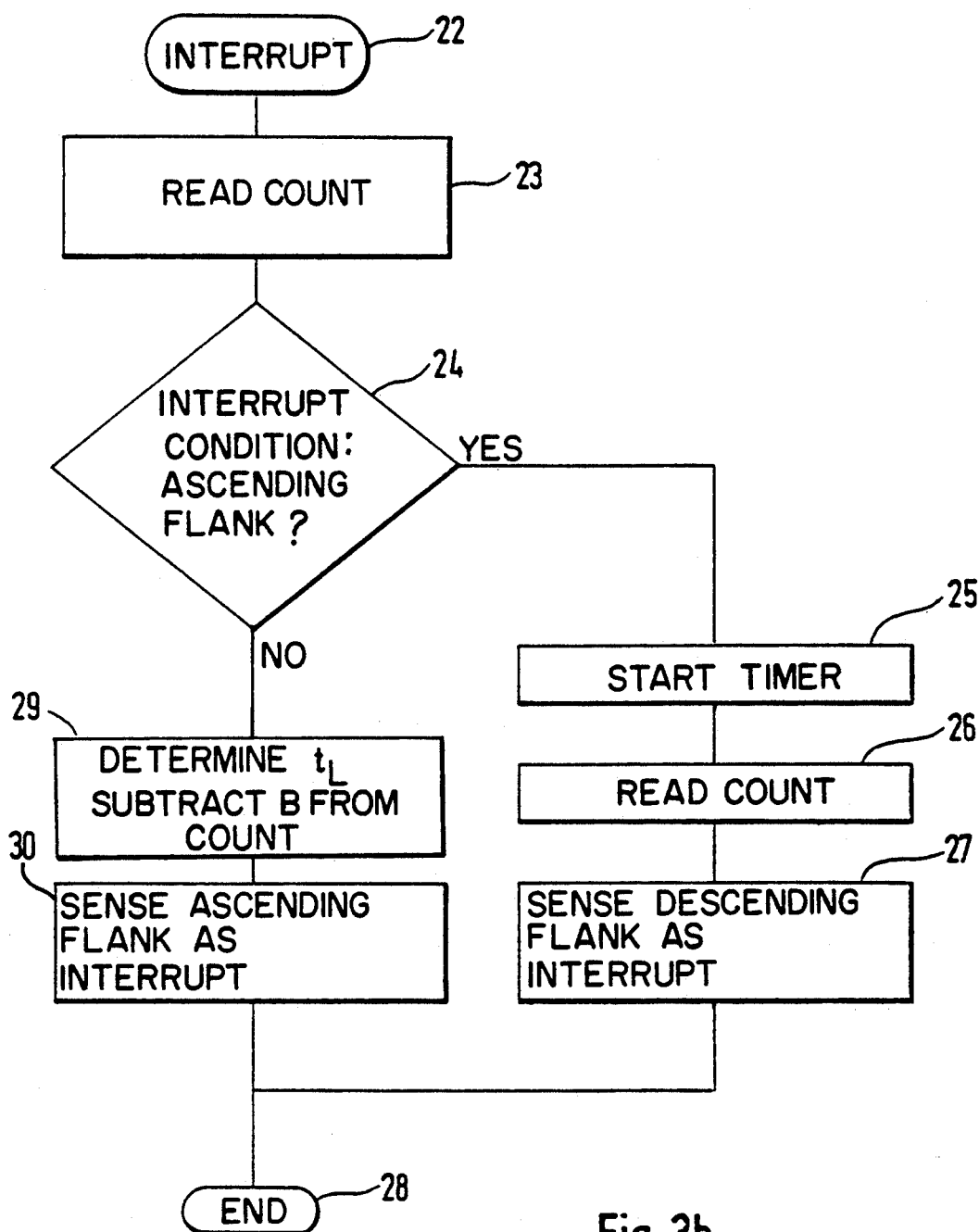
FIGS. 3a and 3b are, respectively, an interrupt condition and an interrupt routine of a program for the microcontroller, which serves for the determination of the coil inductance.

The pulse width $t_L$ is measured with an interrupt routine shown in FIG. 3b. First of all, however, by an initialization 21 (FIG. 3a), an ascending flank of the signal (at line b of FIG. 2) at the INTP input, upon crossing the threshold of the comparator 8, is established as interrupt condition. After the occurrence of an interrupt 22 produced by the ascending flank (FIG. 3b), the actual value of the count of the first timing counter of the microcontroller is first of all captured at 23. The program part 23 is followed by a branching 24 as a function of whether an ascending or a descending flank has been noted as interrupt condition.

In the case of an interrupt produced by an ascending flank, a delay timer is started at 25. The outputted value B of the first timing counter is read at 26 into a register, and represents the time of occurrence of the leading edge of the pulse in line c of FIG. 2. Thereupon a descending flank is to be employed as interrupt condition at the INTP input at 27. The interrupt routine is thus terminated at 28. At the time $T_L$, the time of occurrence of the trailing edge of the pulse on line c of FIG. 2, the a descending flank of the signal in line b of FIG. 2 is present at the INTP input so that the output signal of the comparator 8 changes state with the result that another interrupt is brought about. This time, however, the program branches at 24 in FIG. 3b in the direction towards program step 29. The interrupt triggers the reading of a second timing counter to obtain the time of occurrence of the trailing edge of the pulse on line c of FIG. 2. Therefore, the pulse duration $t_L$ is determined by subtracting the value B from the captured value of the second timing counter. Thereafter an ascending flank is then again employed at 30 as interrupt condition. The program then ends at 28.

FIG. 4 shows a program which commences at 31 with the running down of the delay timer. The analog/digital converter is then read at 32 to obtain $U_R$. The voltage $U_L$ is proportional to the temperature, and is present at the analog input of the microcontroller 4 via the analog/digital converter 3. At 33, pointers for a correction data set are generated by using the voltage $U_R$ and the pulse width $t_L$ as an address to a memory (shown in FIGS. 1 and 5). The value $U_R$ serves as the higher-value byte and the time $t_L$ serves as the lower-value byte of a two-byte address. With this address, the corrected value $t_{Lk}$ is read out of the memory at 34 and the delay timer reset at 35. At 36, the temperature-compensation program is at an end. FIG. 5 shows the construction of the correction data set stored in the memory.

The addresses having a total of 16 binary places necessitates a relatively large storage capacity for the storage of the correction data set shown in FIG. 5, but this capacity can be obtained at low cost with modern components. In order to reduce the required storage capacity, a quantifying, for instance, of the voltage $U_R$ can, however, be effected by evaluating only high-value binary places in those cases in which the corrected values vary relatively slightly.

For cases in which the demands on precision are not as great, an extensive temperature compensation can also be obtained by simple evaluation of $t_L$ with a factor determined by $U_R$.

I claim:

1. A method of compensating for the temperature of an inductive sensor comprising a coil, the inductance of the coil serving to form an output variable which serves as a measurement for a physical variable which is to be measured, the method comprising connecting a resistor in series with the coil to form a series circuit of the resistor and the coil;

applying a first pulse of reference voltage to the series circuit, a resultant voltage drop across the coil being characterized by an internal overshoot pulse followed by a decay to a steady value, the overshoot pulse having a width less than a width of the first pulse;

measuring the width of the overshoot pulse, the width of the overshoot pulse being dependent on a resistance of the coil and a rate of reduction of the coil voltage drop during decay of the overshoot pulse to the steady state value of the coil voltage drop;

measuring the steady state value of voltage;

providing a set of correction values for the output variable, the set of correction values being addressable by an address having the steady state value of the coil voltage drop as a first component of the address and the width of the overshoot pulse as a second component of the address; and reading a correction value corresponding to an address of the set of correction values for correction of the output variable.

2. A method according to claim 1, wherein a correction value for the output variable is obtained from a stored data set of the correction values, the correction value being an amount of inductance based on the temperature of the coil.

3. A method according to claim 1, further comprising:

connecting an input from the coil to an analog-signal input of a microcontroller, and to a first input of a comparator and, via the resistor and a controllable switch, to a source of the reference voltage;

connecting a second input of the comparator via a voltage divider to the source of reference voltage; and connecting an output of the comparator to an interrupt input of the microcontroller.

4. A method according to claim 3, further comprising connecting the input of the coil to ground potential via a diode.

5. A method according to claim 4, wherein the diode is a zener diode.

* * * * *